United States Patent
Virnich et al.

(10) Patent No.: US 8,988,080 B2
(45) Date of Patent: Mar. 24, 2015

(54) CAPACITIVE MEASUREMENT SYSTEM WITH INCREASED ROBUSTNESS AGAINST ELECTRO-MAGNETIC INTERFERENCE

(75) Inventors: Michael Virnich, Korlingen (DE);
 Laurent Lamesch, Reichlange (LU);
 David Hoyer, Ayl (DE); Aloyse Schoos, Bertrange (LU)

(73) Assignee: IEE International Electronics & Engineering S.A., Luxembourg (LU)

( * ) Notice: Subject to any disclaimer, the term of this patent is extended or adjusted under 35 U.S.C. 154(b) by 287 days.

(21) Appl. No.: 13/701,181

(22) PCT Filed: Jun. 8, 2011

(86) PCT No.: PCT/EP2011/059522
 § 371 (c)(1),
 (2), (4) Date: Mar. 15, 2013

(87) PCT Pub. No.: WO2011/154459
 PCT Pub. Date: Dec. 15, 2011

(65) Prior Publication Data
 US 2013/0169291 A1 Jul. 4, 2013

(30) Foreign Application Priority Data

Jun. 8, 2010 (LU) .......................................... 91694

(51) Int. Cl.
 *G01R 29/26* (2006.01)
 *G01R 31/00* (2006.01)
 *H03K 17/955* (2006.01)

(52) U.S. Cl.
 CPC ............ *G01R 31/001* (2013.01); *H03K 17/955* (2013.01); *H03K 2217/960705* (2013.01); *H03K 2217/96077* (2013.01)

USPC .......................................................... 324/613

(58) Field of Classification Search
 CPC ............ H03K 17/955; H03K 17/9622; H03K 17/962; H03K 2217/960705; H03K 2217/96077
 USPC ........................................ 324/658–690, 613
 See application file for complete search history.

(56) References Cited

U.S. PATENT DOCUMENTS

| | | | |
|---|---|---|---|
| 6,025,726 A | 2/2000 | Gershenfeld | |
| 6,225,710 B1 | 5/2001 | Palata | |
| 7,868,874 B2 * | 1/2011 | Reynolds | ...................... 345/173 |
| 2008/0018611 A1 * | 1/2008 | Serban et al. | .................. 345/173 |

(Continued)

FOREIGN PATENT DOCUMENTS

| | | |
|---|---|---|
| WO | 2008039924 A2 | 4/2008 |
| WO | 2008131213 A1 | 10/2008 |

OTHER PUBLICATIONS

International Search Report; International Application No. PCTEP2011/059522; International Application Filing Date Jun. 8, 2011; Mail date Sep. 28, 2011.

(Continued)

*Primary Examiner* — Patrick Assouad
*Assistant Examiner* — Demetrius Pretlow
(74) *Attorney, Agent, or Firm* — Cantor Colburn LLP

(57) ABSTRACT

A method for capacitive sensing comprises the steps of tagging a transmitting signal by modulating a sub-carrier on said signal using state of the art modulation techniques; demodulating said subcarrier out of useful/received signal to prove validity of said signal.

17 Claims, 6 Drawing Sheets

(56) References Cited

U.S. PATENT DOCUMENTS

2008/0309353 A1    12/2008  Cheung
2010/0110037 A1*   5/2010   Huang et al. .................. 345/174

OTHER PUBLICATIONS

Datasheet "MC1496, MC1496B BalancedModulators/Demodulator, ON Semiconductors", Oct. 2006.

Joshua Smith, "Electric Field Sensing for Graphical Interfaces" IEEE Computer Graphics and Applications, published in Computer Graphics I/O Devices, Issue May/Jun. 1998, pp. 54-60.

Paul Horowitz and Winfield Hill, "The Art of Electronics, 2nd edition", p. 185, Fig.4.18.

Arthur B. Williams and Fred J. Taylor, "Electronic Filter Design Handbook", Chapters. 2, 3 and 11.

C. Toumazou, "Current Conveyor Theory and Practice, A.S. Sedra and G.W. Roberts Published in •Advances in Analog Integrated Circuit Design" Peter Peregrinus Limited, London, England, pp. 93-126, 1990.

Written Opinion, International Application No. PCTEP2011/059522; International Application Filing Date Jun. 8, 2011; Mail date Sep. 28, 2011.

* cited by examiner

CAPACITIVE MEASUREMENT SYSTEM WITH INCREASED ROBUSTNESS AGAINST ELECTRO-MAGNETIC INTERFERENCE

FIELD OF THE INVENTION

The present invention generally relates to the technical field of capacitive measurement circuits and more specifically to a capacitive measurement system having one or more electrodes, in which the characteristics of a conductive body such as shape and location are determined by means of capacitive coupling via the electrically conductive body.

BACKGROUND OF THE INVENTION

Capacitive measurement and/or detection systems have a wide range of applications, and are among others widely used for the detection of the presence and/or the position of conductive body in the vicinity of an electrode of the system. A capacitive sensor, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which an oscillating electric signal is applied and which in response emits an electric field into a region of space proximate to the antenna electrode, while the sensor is operating. The sensor comprises at least one sensing electrode—which could comprise the one or more antenna electrodes themselves—at which the influence of an object or living being on the electric field is detected.

The technical paper entitled "Electric Field Sensing for Graphical Interfaces" by J. R. Smith, published in Computer Graphics I/O Devices, Issue May/June 1998, pp 54-60 describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling.

The capacitive coupling is generally determined by applying an alternative voltage signal to a capacitive antenna electrode and by measuring the current flowing from said antenna electrode either towards ground (in the loading mode) or into the second electrode (receiving electrode) in case of the coupling mode. This current is usually measured by means of a transimpedance amplifier, which is connected to the sensing electrode and which converts a current flowing into said sensing electrode into a voltage, which is proportional to the current flowing into the electrode.

Due to this measurement principle, these capacitive measurement systems are generally quite sensitive to parasitic electrical fields, which may disturb the electrical field generated around the antenna electrode and thus influence the capacitive detection. Such parasitic electrical fields may be generated by all kinds of active transmitters (electrical devices etc), which accordingly have the potential to negatively impact the performance of capacitive detection systems.

OBJECT OF THE INVENTION

The object of the present invention is therefore to reduce the influence of active transmitters on the detection performance.

GENERAL DESCRIPTION OF THE INVENTION

In order to overcome the abovementioned problems, the present invention proposes a method for capacitive sensing, said method comprising the steps of
  tagging a transmitting signal by modulating a sub-carrier on said signal using state of the art modulation techniques;
  demodulating said subcarrier out of useful/received signal to prove validity of said signal.
In one embodiment such a method for capacitive sensing comprises for instance the steps of:
  generating a control signal and supplying said control signal to a transmitter, said control signal causing said transmitter to generate a transmitting signal;
  detecting a response signal, said response signal being responsive to a transfer behaviour of a transfer channel for said transmitting signal;
  determining at least one characteristic of said transfer behaviour from said response signal;
  said method further comprising the further steps of:
  tagging said transmitting signal by modulating a sub-carrier signal on said transmitting signal;
  validating the result of said determining step by demodulating said sub-carrier signal out of said response signal.
Said validating step preferably further comprises the step of determining at least one characteristic of said transfer behaviour from said demodulated response signal. Furthermore, said step of tagging said transmitting signal preferably comprises the steps of
  generating a carrier signal and a subcarrier signal,
  supplying said carrier signal and said sub-carrier signal to a first modulator, and
  supplying the output signal of said first modulator as control signal to said transmitter.
It will be appreciated, that in accordance with one embodiment of the present invention, the method for capacitive sensing comprises the steps of
  generating a carrier signal
  generating a first sub-carrier signal,
  supplying said carrier signal and said first sub-carrier signal to a first modulator, and
  supplying the output signal of said first modulator as a first control signal to a transmitter, said first control signal causing said transmitter to generate a first transmitting signal;
  detecting a first response signal, said first response signal being responsive to a transfer behaviour of a transfer channel for said first transmitting signal;
  determining at least one characteristic of said transfer behaviour from said first response signal;

said method further comprising the further steps of validating the result of said determining step by
generating a second sub-carrier signal,
supplying said carrier signal and said second sub-carrier signal to said first modulator, and
supplying the output signal of said first modulator as a second control signal to said transmitter, said second control signal causing said transmitter to generate a second transmitting signal;
detecting a second response signal, said second response signal being responsive to a transfer behaviour of said transfer channel for said second transmitting signal;
determining at least one characteristic of said transfer behaviour from said first response signal;
demodulating said sub-carrier out of said second response signal; and
determining at least one characteristic of said transfer behaviour from said demodulated second response signal.

In a preferred embodiment of this method said first sub-carrier signal is a DC signal and said second sub-carrier signal is a time variant signal. In another possible embodiment, the method further comprises the steps of modulating known information on said sub-carrier signal, and demodulating of said known information out of said sub-carrier to further confirm origin of said response signal. Said known information comprises e.g. a binary protocol. In case of a detected interference one or more bit values in said binary protocol may be varied in order to increase robustness of the measurement.

In other possible embodiments of the invention, the method further comprises frequency hopping of said carrier signal and/or said sub-carrier signal to ensure system availability in case of detected interference and/or variation of transmitted information in case of detected interference.

BRIEF DESCRIPTION OF THE DRAWINGS

Further details and advantages of the present invention will be apparent from the following detailed description of not limiting embodiments with reference to the attached drawings, wherein.

DESCRIPTION OF PREFERRED EMBODIMENTS

Figure 1:
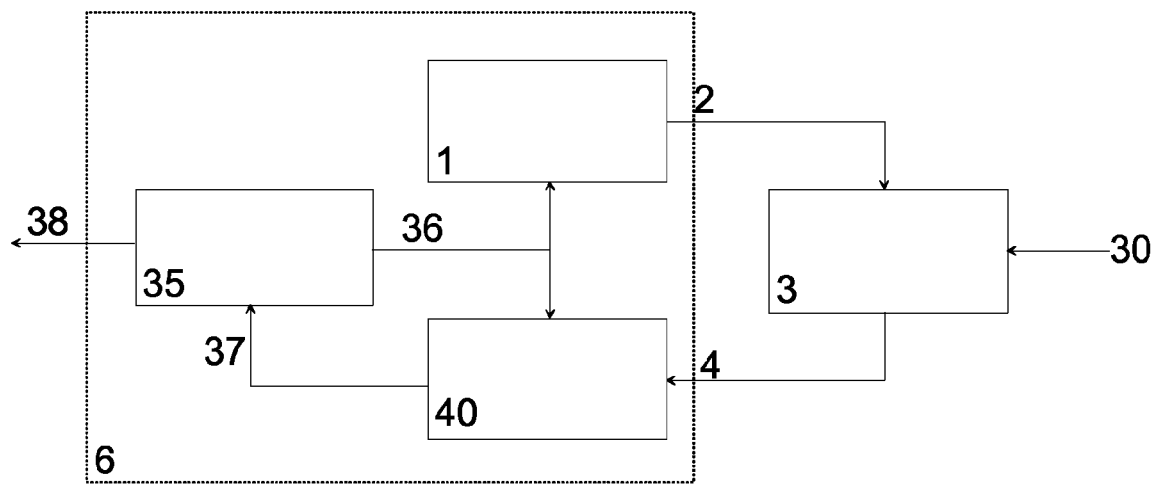
FIG. 1 is a simplified block diagram showing the components of a state-of-the-art coupling-mode capacitive detection system.

Today's coupling-mode capacitive detection systems often correspond to the block diagram indicated in FIG. 1. The different elements represented in this figure are:

| | |
|---|---|
| 1 | transmitter |
| 2 | transmitting signal |
| 3 | transfer channel |
| 4 | receiving signal |
| 6 | sensing unit |
| 30 | disturbing influence |
| 35 | control unit |
| 36 | control signal |
| 37 | useful signal |
| 38 | data output |
| 40 | useful signal extractor |

A control unit 35 generates a control signal 36 necessary for the transmitter 1 to generate a transmitting signal 2 and for a useful signal extractor 40 to convert the receiving signal 4 into the useful signal 37. The transmitting signal 2 passes through a transfer channel 3. The transfer channel 3, e.g. a complex impedance Z(jw), has a certain transfer behaviour. Said transfer behaviour directly impacts the receiving signal 4 and thus the useful signal 37, which is evaluated by the control unit 35. Depending on the useful signal's properties, the control unit 35 concludes on the transfer behaviour of transfer channel 3, e.g. on the impedance Z(jw), and derives information that are delivered to the environment via the data output signal 38.

Transmitter 1, useful signal extractor 40 and control unit 35 may (but must not necessarily) be configured as one unit 6.

Disturbing influences 30 like external radiation (EMI) might also enter the transfer channel 3. These influences cause a disturbing signal part in the receiving signal 4 and, thus, a disturbing signal in the useful signal 37. The disturbing signal part in the useful signal 37 can have the potential to degrade the determination of the transfer behaviour of the transfer channel 3. As a consequence, the information derived out of the useful signal 37 by the control unit 35 might be wrong.

Figure 2:
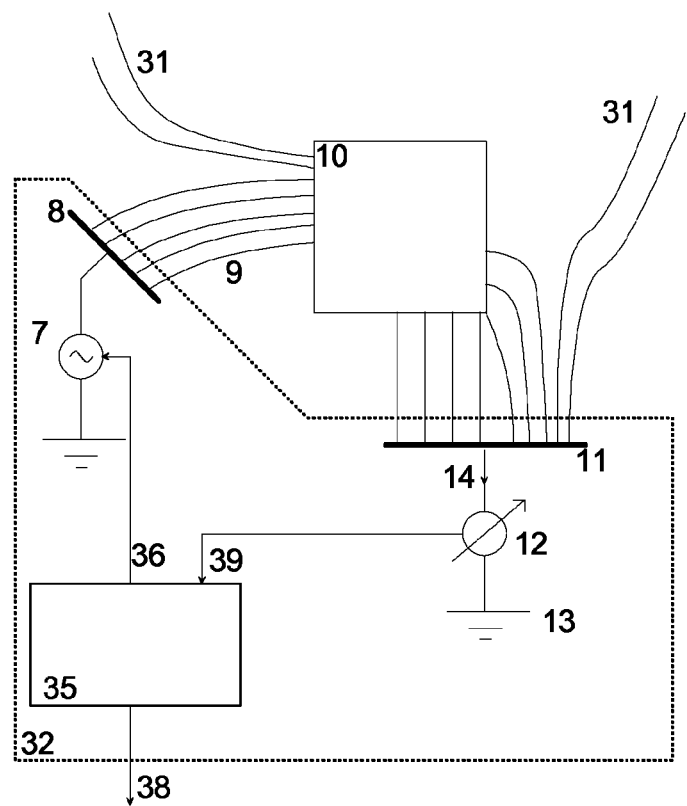
FIG. 2 is a schematic view of a coupling mode capacitive detection system in an application for the occupant detection in a vehicle seat.

A typical application of the detection system of FIG. 1 relating to the field of capacitive occupant detection system in an automotive vehicle is shown in FIG. 2. The different elements represented in this figure are:

| | |
|---|---|
| 7 | AC voltage |
| 8 | transmitting electrode |
| 9 | an electrical field |
| 10 | person whose presence is to be detected |
| 11 | receiving electrode |

-continued

| 12 | low-ohmic current meter |
| 13 | ground potential |
| 14 | AC current |
| 31 | disturbing electrical field |
| 32 | vehicle seat |
| 35 | control unit |
| 36 | measurement signal |
| 38 | data output |
| 39 | measured AC current |

The capacitive system is assembled in a vehicle seat 32. Its purpose is to determine the status of occupation of said vehicle seat to adapt the airbag deployment in case of a crash.

A control unit 35 outputs a measurement signal to an AC voltage source 7, which drives a corresponding voltage at the transmitting electrode 8. A receiving electrode 11 is connected to ground potential 13 via a low ohmic current meter 12. Due to the difference in potential between transmitting electrode 8 and receiving electrode 11, an electrical field 9 forms and causes the AC current 14 to flow. Said AC current can be of constant or of varying frequency in case where the frequency of the AC voltage source 7 varies as well. Said current is measured by the low-ohmic current meter 12 and evaluated in e.g. phase angle and amplitude to determine whether there is a person 10 sitting on the vehicle seat 32 or not. Also the variation over frequency of said phase angle and amplitude of said current can be subject of evaluation. The detected status of seat occupation is delivered to the airbag control unit of the vehicle via the data output 38 to adapt the airbag deployment in case of a crash.

Disturbing electrical fields 31 coupled into the person 10 or into the receiving electrode 11 can cause a disturbing signal part in the measured AC current 14 beyond the useful part which has its basic origin in the AC voltage 7 applied to the transmitting electrode 8. The disturbing signal part in the AC current 14 causes a disturbing part in the measured AC current 39 evaluated by the control unit 35. Said disturbing part can have the potential to trigger a wrong classification, e.g. a person is detected if no person is positioned on the passenger seat or the person is not detected although it is sitting on the seat. This wrong classification can cause a danger in case where e.g. a child seat is detected as a person, which possibly enables the airbag for deployment in case of a crash.

Figure 3:
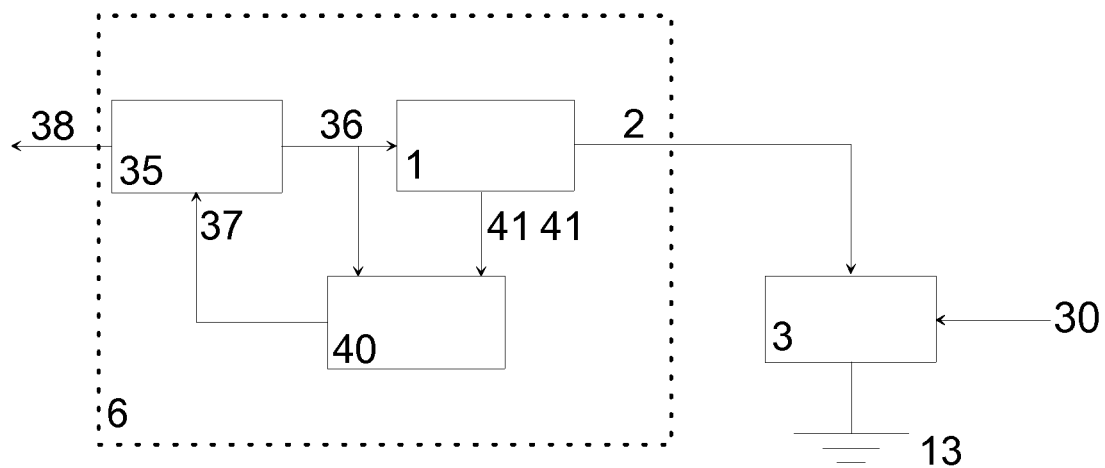
FIG. 3 is a simplified block diagram showing the components of a state-of-the-art loading-mode capacitive detection system.

State-of-the-art loading-mode capacitive detection systems usually correspond to the block diagram indicated in FIG. 3. The different elements represented in this figure are:

| 1 | transmitter |
| 2 | transmitting signal |
| 3 | transfer channel |
| 6 | sensing unit |
| 13 | ground potential |
| 30 | disturbing influence |
| 35 | control unit |
| 36 | control signal |
| 37 | useful signal |
| 38 | data output |
| 40 | useful signal extractor |
| 41 | transmitter internal signal |

A control unit 35 generates a control signal 36 necessary for the transmitter 1 to generate a transmitting signal 2 and for the useful signal extractor 40 to convert the transmitter internal signal 41 into the useful signal 37. The transmitting signal 2 passes through a transfer channel 3. The transfer channel 3, e.g. a complex impedance Z(jw) to ground potential 13, has a certain transfer behaviour. The transmitter internal signal 41 is in direct dependence to the transfer behaviour of the transfer channel 3. Changes on the transmitting signal 2 or on the transfer channel 3 directly impact the transmitter internal signal 41 and, thus, the useful signal 37, which is evaluated by the control unit 35. Depending on the properties of the useful signal 37, the control unit 35 concludes on the transfer behaviour of transfer channel 3, e.g. on the impedance Z(jw) to ground potential 13 and derives information that are delivered to the environment via the data output signal 38. Transmitter 1, useful signal extractor 40 and control unit 35 can be, but must not be, implemented as one unit 6.

Disturbing influences 30 like external radiation (EMI) might enter the transfer channel 3. These influences cause a disturbing signal part in the transmitter internal signal 41 and, thus, a disturbing signal in the useful signal 37. The disturbing signal part in the useful signal 37 can have the potential to degrade the determination of the transfer behaviour of the transfer channel 3. As consequence, the information derived by the control unit 35 out of the useful signal 37 might be wrong.

Figure 4:
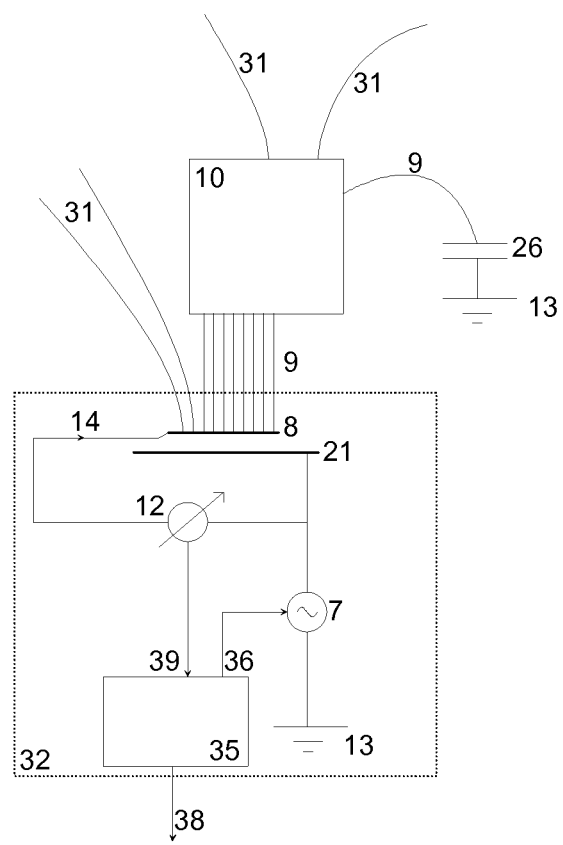
FIG. 4 is a schematic view of a loading mode capacitive detection system in an application for the occupant detection in a vehicle seat.

A typical application of the detection system of FIG. 3 relating to the field of capacitive occupant detection system in an automotive vehicle is shown in FIG. 4. The different elements represented in this figure are:

| 7 | AC voltage source |
| 8 | transmitting electrode |
| 9 | electrical field |
| 10 | person whose presence is to be detected |
| 12 | low-ohmic current meter |
| 13 | ground potential |
| 14 | transmitting current |
| 21 | optional shield electrode |
| 26 | person's capacitance to ground potential |
| 31 | disturbing electrical field |
| 32 | vehicle seat |
| 35 | control unit |
| 36 | measurement signal |
| 38 | data output |
| 39 | measured AC current |

The capacitive system is assembled in a vehicle seat 32. Its purpose is to determine the status of occupation to adapt the airbag deployment in case of a crash.

A control unit 35 outputs a measurement signal 36 to an AC voltage source 7, which drives a corresponding voltage at the transmitting electrode 8 and, optionally, to a shield electrode 21. The electrodes are assembled in a vehicle seat 25. Due to the difference in potential between transmitting electrode and ground potential 13, an electrical field 9 forms and causes the AC current 14 to flow. Said AC current can be of constant or of varying frequency in case where the frequency of the AC voltage source 7 varies as well. Said current is measured by the low-ohmic current meter 12 and evaluated in e.g. phase angle and amplitude to determine whether there is a person 10 sitting on the vehicle seat 32 or not. Also the variation over frequency of said phase angle and amplitude of said current can be subject of evaluation. The detected status of seat occupation is delivered to the airbag control unit of the vehicle via the data output 38 to adapt the airbag deployment in case of a crash.

Disturbing electrical fields 31 coupled into the person 10 or into the transmitting electrode 8 can cause a disturbing signal part in the measured AC current 39 beyond the useful part which has its basic origin in the AC voltage 7 applied to the transmitting electrode 8. Said disturbing part can have the potential to trigger a wrong classification, e.g. a person is detected if no person is positioned on the passenger seat or the person is not detected although it is sitting on the seat. This wrong classification can cause a danger in case where e.g. a child seat is detected as a person, which possibly enables the airbag for deployment in case of a crash.

The drawback of the shown measurement concepts concerning the disturbing influence of external radiation is that once a disturbance is able to pass through the useful signal extractor 40 in FIG. 1 and FIG. 3, it is difficult for the control unit 35 to explicitly distinguish between the part of the useful signal 37 having its origin in the transmitting signal 2 and the part caused by the disturbance itself.

In order to alleviate this situation, the present invention proposes to rely on active tagging of the transmitting signal. If it is possible to tag the transmitting signal with e.g. certain information, it is possible, after extraction of the information e.g. in the useful signal extractor, to identify which part of the useful signal has its origin in the transmitting signal and which part of the useful signal is caused by a disturbance.

Figure 5:
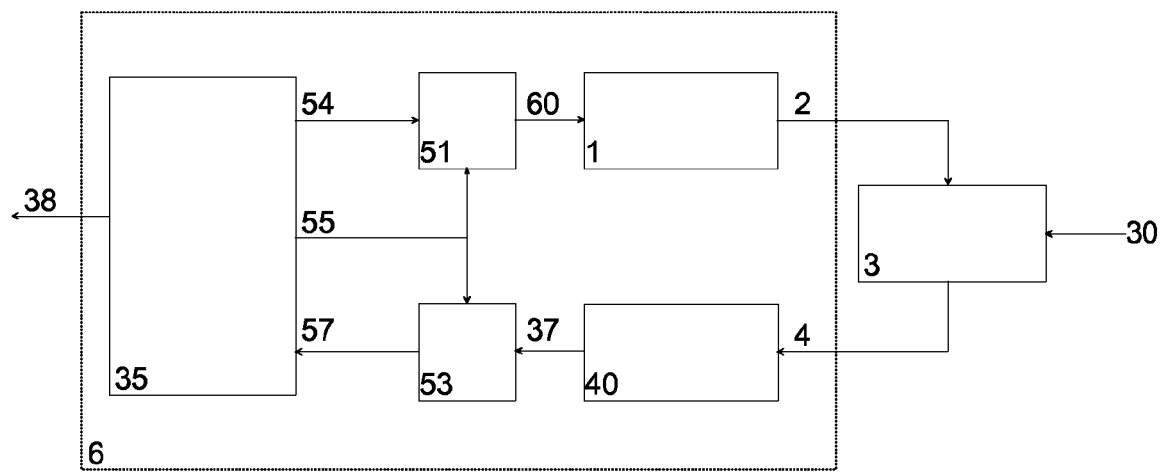
FIG. 5 is a simplified block diagram showing the components of a first embodiment of a coupling-mode capacitive detection system according to the present invention.

FIG. 5 shows a block diagram of a coupling mode capacitive detection system with active tagging of the transmitting signal by subcarrier modulation. The different elements represented in this figure are:

| | |
|---|---|
| 1 | transmitter |
| 2 | transmitting signal |
| 3 | transfer channel |
| 4 | receiving signal |
| 6 | sensing unit |
| 30 | disturbing influence |
| 35 | control unit |
| 37 | useful signal |
| 38 | data output |
| 40 | useful signal extractor |
| 51 | first modulator |
| 53 | first demodulator |
| 54 | subcarrier signal |
| 55 | carrier signal |
| 57 | received subcarrier |
| 60 | output of the first modulator |

The control unit 35 generates a carrier signal 55 and a subcarrier signal 54 and feeds it into the first modulator 51. The output 60 of said modulator sources the transmitter 1, which generates the transmitting signal 2. The transmitting signal 2 passes the transfer channel 3, e.g. a complex impedance Z(jw), and superposes with disturbances having its origin in the disturbing influence 30. The useful signal extractor 40 receives the receiving signal 4, extracts the useful signal 37 and feds it into the first demodulator 53. Said demodulator is synchronized to the carrier 55, demodulates the received subcarrier 57 out the useful signal 37 and outputs it to the control unit 35.

By applying e.g. a DC signal as subcarrier signal 54 to the first modulator 51, the output signal 57 of the first demodulator can be evaluated in e.g. phase angle and amplitude to conclude on the transfer behaviour of transfer channel 3, e.g. on the impedance Z(jw). This result is to be confirmed for validity since the disturbing influence 30 might have caused a wrong measurement result.

Validation of the measurement result is performed by the control unit 35 by applying a time variant subcarrier signal 54 to the first modulator 51, checking for subcarrier existence in the demodulated signal 57 and by assessing the properties of the demodulated subcarrier signal 57, e.g. its phase angle or its amplitude in relation to the carrier amplitude.

If the subcarrier check proves that the measurement of the transfer behaviour of the transfer channel 3 was valid and not disturbed by a disturbing influence 30, the control unit derives information out of the transfer channel property measurement result and sends it to the environment via the data output signal 38.

Figure 6:
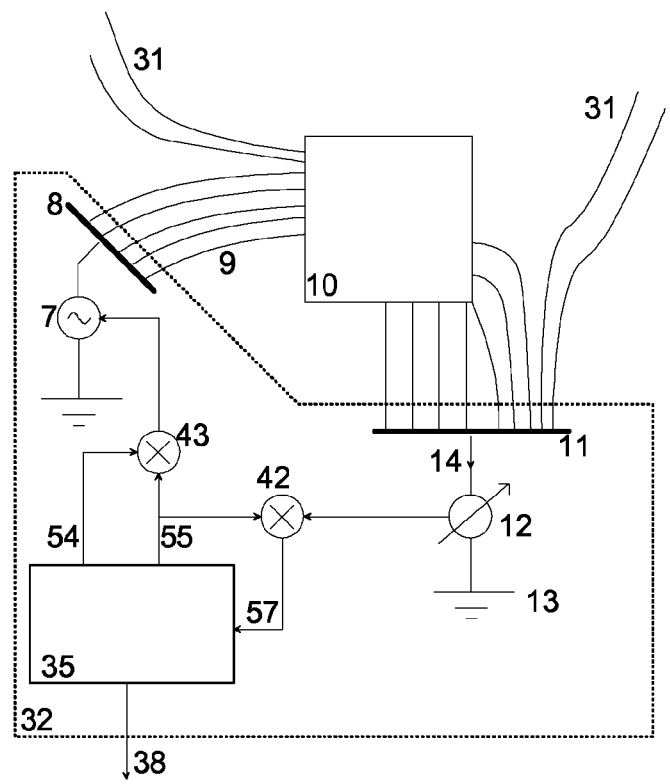
FIG. 6 is a schematic view of the capacitive detection system of FIG. 5 in an application for the occupant detection in a vehicle seat.

A typical application of the detection system of FIG. 5 relating to the field of capacitive occupant detection system in an automotive vehicle is shown in FIG. 6. The different elements represented in this figure are:

| | |
|---|---|
| 7 | AC voltage |
| 8 | transmitting electrode |
| 9 | electrical field |
| 10 | person whose presence is to be detected |
| 11 | receiving electrode |
| 12 | low-ohmic current meter |
| 13 | ground potential |
| 14 | AC current |
| 31 | disturbing electrical field |
| 32 | vehicle seat |
| 35 | control unit |
| 38 | data output |
| 42 | mixer |
| 43 | mixer |
| 54 | subcarrier signal |
| 55 | carrier signal |
| 57 | received subcarrier |

The control unit 35 generates a carrier signal 55 and subcarrier signal 54 and feeds it into the mixer 43. The voltage source 7 drives a voltage at transmitting electrode 8 which is in direct relation to the output of mixer 43. The difference in potential between transmitting electrode 8 and receiving electrode 11, which is connected to GND via a low ohmic current meter 12, causes an electrical field 9 to form, resulting in a complex impedance Z(jw) between transmitting electrode 8 and receiving electrode 11. A person 10, whose presence on the vehicle seat 32 shall be detected, influences this impedance.

Due to the complex impedance Z(jw) between both electrodes, an AC current 14 flows from transmitting electrode 8 to receiving electrode 11. Said current is measured by the current meter 12 and is mixed by mixer 42 with the carrier signal 55. The control unit 35 characterizes the complex impedance Z(jw) in e.g. phase angle, absolute value or frequency dependency by evaluating signal 57 while keeping subcarrier signal 54 at DC.

Validation of the measurement result is performed by the control unit 35 by applying e.g. a sinusoidal subcarrier signal 54 of e.g. 1 KHz to the first mixer 43, checking for subcarrier existence in the demodulated signal 57 and by assessing the properties of the demodulated subcarrier signal 57, e.g. its phase angle or its amplitude in relation to the absolute value of Z(jw).

Figure 7:
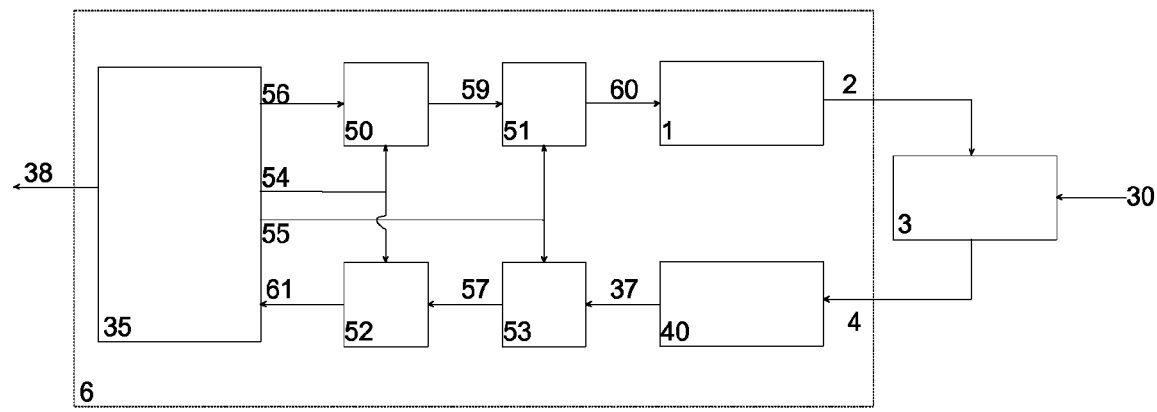
FIG. 7 is a simplified block diagram showing the components of a second embodiment of a coupling-mode capacitive detection system according to the present invention.

The embodiment shown in FIG. 5 may be further enhanced to further increase the selectivity of the system by tagging the transmission signal by means of binary protocol transmission. Such an embodiment of the capacitive sensing system is represented in FIG. 7. The different elements represented in this figure are:

| | |
|---|---|
| 1 | transmitter |
| 2 | transmitting signal |
| 3 | transfer channel |
| 4 | receiving signal |
| 6 | sensing unit |
| 30 | disturbing influence |
| 35 | control unit |

| | |
|---|---|
| 37 | useful signal |
| 38 | data output |
| 40 | useful signal extractor |
| 50 | second modulator |
| 51 | first modulator |
| 52 | second demodulator |
| 53 | first demodulator |
| 54 | subcarrier signal |
| 55 | carrier signal |
| 56 | binary protocol |
| 57 | output of the first demodulator |
| 59 | output of the second modulator |
| 60 | output of the first modulator |
| 61 | demodulated binary protocol |

The control unit 35 generates a carrier signal 55 and a subcarrier signal 54. The carrier signal 55 is fed into the first modulator 51. The subcarrier signal 54 is fed into the second modulator 50. The output 59 of the second modulator 50 is connected to the input of the first modulator 51. The output 60 of the first modulator 51 is connected to the input of the transmitter 1. The control unit 35 applies a binary protocol 56 to the input of the second demodulator 50. The transmitting signal 2 passes the transfer channel 3, e.g. a complex impedance Z(jw), and superposes with disturbances having its origin in the disturbing influence 30. The useful signal extractor 40 receives the receiving signal 4, extracts the useful signal 37 and feeds it into the first demodulator 53, which is synchronized to the carrier 55. Said demodulator demodulates the received subcarrier 57 out the useful signal 37 and inputs it to the second demodulator 52, which is synchronized to the subcarrier signal 54 and which demodulates the binary protocol 61. Said binary protocol is sent to the control unit 35.

By applying e.g. a binary 'one' as binary protocol and a DC signal as subcarrier signal 54 to the second modulator 50; the output signal 61 of the second demodulator can be evaluated in e.g. phase angle and amplitude to conclude on the transfer behaviour of transfer channel 3, e.g. on the impedance Z(jw). This result is to be confirmed for validity since the disturbing influence 30 might have caused a wrong measurement result.

Validation of the measurement result is performed by the control unit 35 by applying e.g. sinusoidal subcarrier signal 54 of e.g. 1 KHz and a binary protocol 56 sequence to the second modulator 50. The control unit 35 can check for subcarrier existence and properties in the demodulated binary protocol signal 61 during constant bit values of the sent binary protocol 56. The properties of the received subcarrier signal can be evaluated in e.g. its phase angle or its amplitude in relation to the carrier amplitude. In addition, to further increase the selectivity of the detection system, the demodulated binary protocol 61 can be compared with the sent binary protocol 56.

If the subcarrier check and the binary protocol check prove that the measurement of the transfer behaviour of the transfer channel 3 was valid and not disturbed by a disturbing influence 30, the control unit derives information out of the transfer channel property and sends it to the environment via the data output signal 38.

Figure 8:
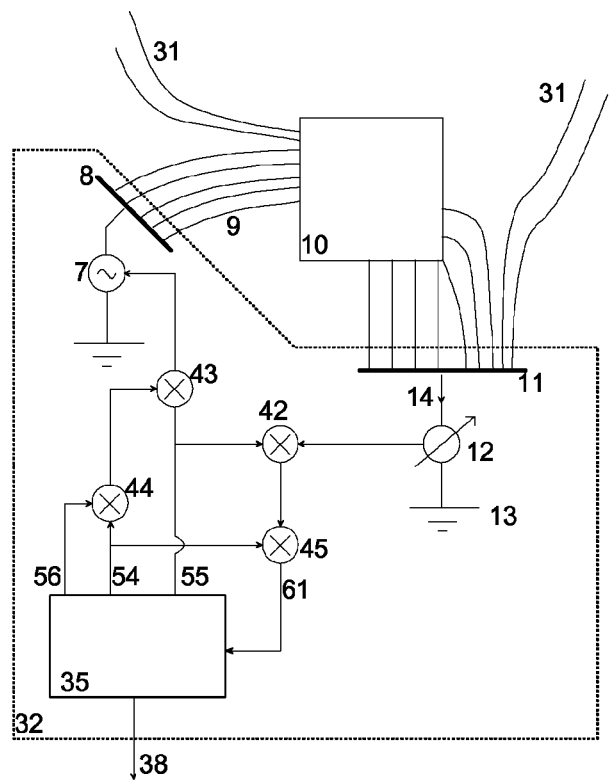
FIG. 8 is a schematic view of the capacitive detection system of FIG. 7 in an application for the occupant detection in a vehicle seat.

A typical application of the detection system of FIG. 7 relating to the field of capacitive occupant detection system in an automotive vehicle is shown in FIG. 8. The different elements represented in this figure are:

| | |
|---|---|
| 7 | AC voltage |
| 8 | transmitting electrode |
| 9 | electrical field |
| 10 | person whose presence is to be detected |
| 11 | receiving electrode |
| 12 | low-ohmic current meter |
| 13 | ground potential |
| 14 | AC current |
| 31 | disturbing electrical field |
| 32 | vehicle seat |
| 35 | control unit |
| 38 | data output |
| 42 | mixer |
| 43 | mixer |
| 44 | mixer |
| 45 | mixer |
| 54 | subcarrier signal |
| 55 | carrier signal |
| 56 | binary protocol |
| 61 | demodulated binary protocol |

The control unit 35 generates a carrier signal 55, a subcarrier signal 54 and a binary protocol signal 56. Subcarrier signal 54 and binary protocol signal 56 are fed into mixer 44. The output of mixer 44 is fed into mixer 43 together with carrier signal 55. The voltage source 7 drives a voltage at transmitting electrode 8 which is in direct relation to the output of mixer 43. The difference in potential between transmitting electrode 8 and receiving electrode 11, which is connected to GND via a low ohmic current meter 12, causes an electrical field 9 to form, resulting in a complex impedance Z(jw) between transmitting electrode 8 and receiving electrode 11. A person 10, whose presence on the vehicle seat 32 shall be detected, influences this impedance.

Due to the complex impedance Z(jw) between both electrodes, an AC current 14 flows from transmitting electrode 8 to receiving electrode 11. This current is measured by the current meter 12 and is mixed by mixer 42 with the carrier signal 55. The output of mixer 42 is mixed again with the subcarrier signal 54 by mixer 45. The output of mixer 45 is input to control unit 35.

The control unit 35 characterizes the complex impedance Z(jw) in e.g. phase angle, absolute value or frequency dependency by evaluating signal 61 while keeping subcarrier signal 54 at DC and the binary values of the binary signal 56 constant.

Validation of the measurement result is performed by the control unit 35 by applying e.g. a sinusoidal subcarrier signal 54 of e.g. 1 KHz and a binary protocol 56 to mixer 44. The control unit 35 can check for subcarrier existence and properties in the demodulated binary protocol signal 61 during constant bit values of the sent binary protocol 56. The properties of the received subcarrier signal can be evaluated in e.g. its phase angle or its amplitude in relation to the absolute value of impedance Z(jw). In addition, the demodulated binary protocol 61 can be compared with the sent binary protocol 56.

Figure 9:
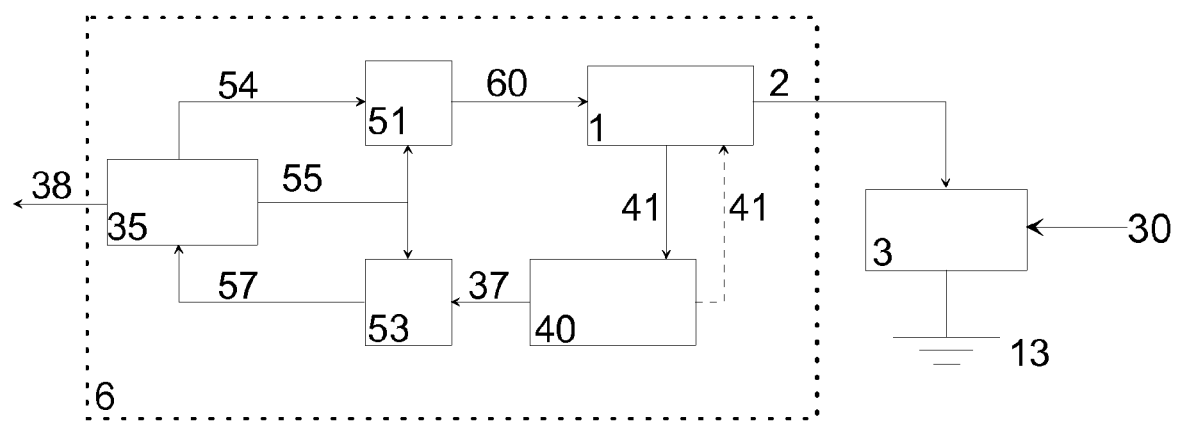
FIG. 9 is a simplified block diagram showing the components of a first embodiment of a loading-mode capacitive detection system according to the present invention.

The tagging principle shown in FIG. 5 can be also applied to the topology indicated in FIG. 3. FIG. 9 shows how 'active transmitting signal tagging by subcarrier modulation' can be applied to a loading mode capacitive sensor system. The different elements represented in this figure are:

| | |
|---|---|
| 1 | transmitter |
| 2 | transmitting signal |
| 3 | transfer channel |
| 6 | sensing unit |
| 13 | ground potential |

| | |
|---|---|
| 30 | disturbing influence |
| 35 | control unit |
| 37 | useful signal |
| 38 | data output |
| 40 | useful signal extractor |
| 41 | transmitter internal signal |
| 51 | first modulator |
| 53 | first demodulator |
| 54 | subcarrier signal |
| 55 | carrier signal |
| 57 | output of the first demodulator |
| 60 | output of the first modulator |

The control unit 35 generates a carrier signal 55 and subcarrier signal 54 and feeds it into the first modulator 51. The output 60 of said modulator sources the transmitter 1. In order to output the transmitting signal 2, the transmitter generates an internal signal 41, which is made accessible for the useful signal extractor 40. The transmitting signal 2 passes the transfer channel 3, e.g. a complex impedance Z(jw) to ground potential 13, and superposes with disturbances having its origin in the disturbing influence 30. The useful signal extractor 40 extracts the useful signal 37 out of the transmitter internal signal 41 and feds it into the first demodulator 53. Said demodulator is synchronized to the carrier 55, demodulates the subcarrier component 57 out the useful signal 37 and outputs it to the control unit 35.

By applying e.g. a DC signal as subcarrier signal 54 to the first modulator 51, the output signal 57 of the first demodulator can be evaluated in e.g. phase angle and amplitude to conclude on the transfer behaviour of transfer channel 3, e.g. on the impedance Z(jw). This result is to be confirmed for validity since the disturbing influence 30 might have caused a wrong measurement result.

Validation of the measurement result is performed by the control unit 35 by applying e.g. a sinusoidal subcarrier signal 54 of e.g. 1 KHz to the first modulator 51, checking for subcarrier existence in the demodulated signal 57 and by assessing the properties of the demodulated subcarrier signal 57, e.g. its phase angle or its amplitude in relation to the absolute value of impedance Z(jw).

If the subcarrier check proves that the measurement of the transfer behaviour of the transfer channel 3 was valid and not disturbed by a disturbing influence 30, the control unit derives information out of the transfer channel properties and sends it to the environment via the data output signal 38.

Figure 10:
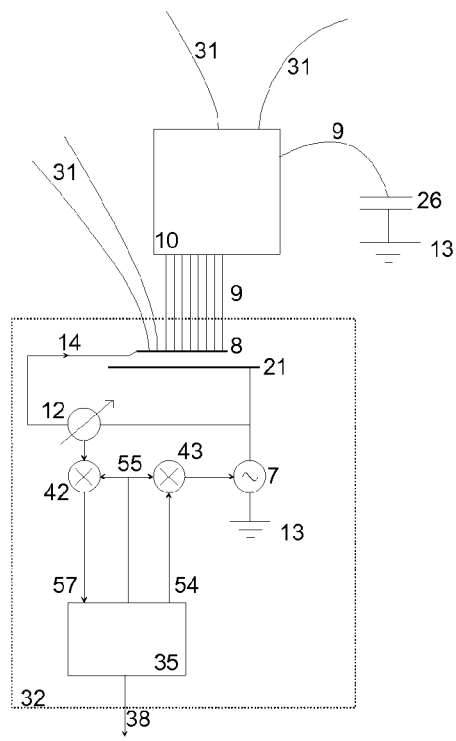
FIG. 10 is a schematic view of the capacitive detection system of FIG. 9 in an application for the occupant detection in a vehicle seat.

A typical application of the detection system of FIG. 9 relating to the field of capacitive occupant detection system in an automotive vehicle is shown in FIG. 10. The different elements represented in this figure are:

| | |
|---|---|
| 7 | AC voltage source |
| 8 | transmitting electrode |
| 9 | electrical field |
| 10 | person whose presence is to be detected |
| 12 | low-ohmic current meter |
| 13 | ground potential |
| 14 | transmitting current |
| 21 | optional shield electrode |
| 26 | person's capacitance to ground potential |
| 31 | disturbing electrical field |
| 32 | vehicle seat |
| 35 | control unit |
| 38 | data output |
| 42 | mixer |
| 43 | mixer |

| | |
|---|---|
| 54 | subcarrier signal |
| 55 | carrier signal |
| 57 | received subcarrier |

The control unit 35 generates a carrier signal 55 and subcarrier signal 54 and feeds it into the mixer 43. The voltage source 7 drives a voltage at transmitting electrode 8 and optional at shield electrode 21 which is in direct relation to the output of mixer 43. Due to the difference in potential between transmitting electrode 8 and ground potential 13, an electrical field 9 forms, resulting in a complex impedance Z(jw) between transmitting electrode 8 and ground potential 13. A person 10, whose presence on the vehicle seat 32 shall be detected, influences this impedance. Said impedance causes the AC current 14 to flow, which is measured by the low-ohmic current meter 12 and mixed with carrier signal 55. The control unit 35 characterizes the complex impedance Z(jw) in e.g. phase angle, absolute value or frequency dependency by evaluating signal 57 while keeping subcarrier signal 54 at DC.

Validation of the measurement result is performed by control unit 35 by applying e.g. a sinusoidal subcarrier signal 54 of e.g. 1 KHz to the first mixer 43, checking for subcarrier existence in the demodulated signal 57 and by assessing the properties of the demodulated subcarrier signal 57, e.g. its phase angle or its amplitude in relation to the absolute value of Z(jw).

Figure 11:
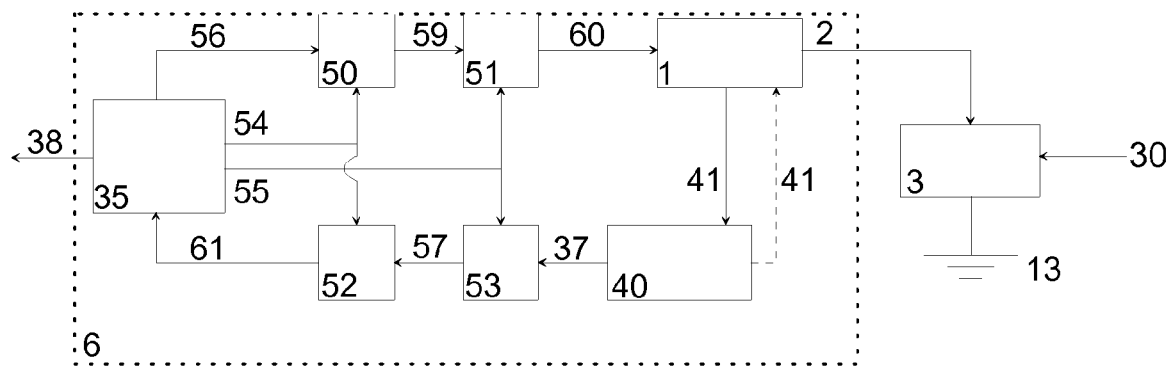
FIG. 11 is a simplified block diagram showing the components of a second embodiment of a loading-mode capacitive detection system according to the present invention.

The tagging principle shown in FIG. 7 can be also applied to the topology indicated in FIG. 3. FIG. 11 shows how 'active transmitting signal tagging by binary protocol transmission' can be applied to a loading mode topology. The different elements represented in this figure are:

| | |
|---|---|
| 1 | transmitter |
| 2 | transmitting signal |
| 3 | transfer channel |
| 6 | sensing unit |
| 13 | ground potential |
| 30 | disturbing influence |
| 35 | control unit |
| 37 | useful signal |
| 38 | data output |
| 40 | useful signal extractor |
| 41 | transmitter internal signal |
| 50 | second modulator |
| 51 | first modulator |
| 52 | second demodulator |
| 53 | first demodulator |
| 54 | subcarrier signal |
| 55 | carrier signal |
| 56 | binary protocol |
| 57 | output of the first demodulator |
| 59 | output of the second modulator |
| 60 | output of the first modulator |
| 61 | demodulated binary protocol |

The control unit 35 generates a carrier signal 55 and subcarrier signal 54. The carrier signal 55 is fed into the first modulator 51. The subcarrier signal 54 is fed into the second modulator 50. The output 59 of the second modulator 50 is connected to the input of the first modulator 51. The output 60 of the first modulator 51 is connected to the input of the transmitter 1. The control unit 35 applies a binary protocol 56 to the input of the second demodulator 50. The transmitting signal 2 passes the transfer channel 3, e.g. a complex impedance Z(jw) to ground potential 13, and superposes with disturbances having its origin in the disturbing influence 30. The useful signal extractor 40 extracts the useful signal 37 out of the transmitter internal signal 41 and feds it into the first demodulator 53. Said demodulator is synchronized to the carrier 55, demodulates the subcarrier component 57 out the useful signal 37 and inputs it to the second demodulator 52, which is synchronized to the subcarrier signal 54 and which demodulates the binary protocol 61. Said binary protocol is output to the control unit 35.

By applying e.g. a binary 'one' as binary protocol and a DC signal as subcarrier signal 54 to the second modulator 50; the output signal 61 of the second demodulator can be evaluated in e.g. phase angle and amplitude to conclude on the transfer behaviour of transfer channel 3, e.g. on the impedance Z(jw). This result is to be confirmed for validity since the disturbing influence 30 might have caused a wrong measurement result.

Validation of the measurement result is performed by the control unit 35 by applying e.g. a sinusoidal subcarrier signal 54 of e.g. 1 KHz and a binary protocol 56 to the second modulator 50. The control unit 35 can check for subcarrier existence and properties in the demodulated binary protocol signal 61 during constant bit values of the sent binary protocol 56. The properties of the received subcarrier signal can be evaluated in e.g. its phase angle or its amplitude in relation to the absolute value of impedance Z(jw). In addition, to further increase the selectivity of the detection system, the demodulated binary protocol 61 can be compared with the sent binary protocol 56.

If the subcarrier check and the binary protocol check prove that the measurement of the transfer behaviour of the transfer channel 3 to ground potential 13 was valid and not disturbed by a disturbing influence 30, the control unit derives information out of the transfer channel properties and sends it to the environment via the data output signal 38.

Figure 12:
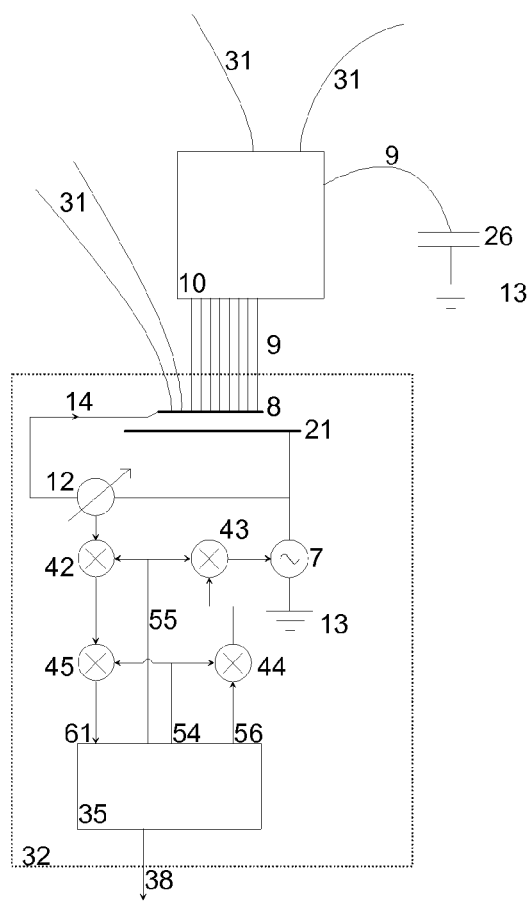
FIG. 12 is a schematic view of the capacitive detection system of FIG. 11 in an application for the occupant detection in a vehicle seat.

A typical application of the detection system of FIG. 11 relating to the field of capacitive occupant detection system in an automotive vehicle is shown in FIG. 12. The different elements represented in this figure are:

| 7  | AC voltage source |
|----|-------------------|
| 8  | transmitting electrode |
| 9  | electrical field |
| 10 | person whose presence is to be detected |
| 12 | low-ohmic current meter |
| 13 | ground potential |
| 14 | transmitting current |
| 21 | optional shield electrode |
| 26 | person's capacitance to ground potential |
| 31 | disturbing electrical field |
| 32 | vehicle seat |
| 35 | is a control unit |
| 38 | data output |
| 42 | mixer |
| 43 | mixer |
| 44 | mixer |
| 45 | mixer |
| 54 | subcarrier signal |
| 55 | carrier signal |
| 56 | binary protocol |
| 61 | demodulated binary protocol |

The control unit 35 generates a carrier signal 55, a subcarrier signal 54 and a binary protocol signal 56. Subcarrier signal 54 and binary protocol signal 56 are fed into mixer 44. The output of mixer 44 is fed into mixer 43 together with carrier signal 55. The voltage source 7 drives a voltage at transmitting electrode 8 and optional at shield electrode 21 which is in direct relation to the output of mixer 43. Due to the difference in potential between transmitting electrode and ground potential 13, an electrical field 9 forms, resulting in a complex impedance Z(jw) between transmitting electrode 8 and ground potential 13. A person 10, whose presence on the vehicle seat 32 shall be detected, influences this impedance. Said impedance causes the AC current 14 to flow, which is measured by the low-ohmic current meter 12 and mixed with carrier signal 55. The output of mixer 42 is mixed again with the subcarrier signal 54 by mixer 45. The output of mixer 45 is input to control unit 35. The control unit 35 characterizes the complex impedance Z(jw) in e.g. phase angle, absolute value or frequency dependency by evaluating signal 61 while keeping subcarrier signal 54 at DC and the binary values of the binary signal 56 constant.

Validation of the measurement result is performed by the control unit 35 by applying e.g. a sinusoidal subcarrier signal 54 of e.g. 1 KHz and a binary protocol 56 to mixer 44. The control unit 35 can check for subcarrier existence and properties in the demodulated binary protocol signal 61 during constant bit values of the sent binary protocol 56. The properties of the received subcarrier signal can be e.g. its phase angle or its amplitude in relation to the absolute value of impedance Z(jw). In addition, the demodulated binary protocol 61 can be compared with the sent binary protocol 56.

It will be noted that the system availability of the above described embodiments in case of detected interference my be further improved. As result of a detected interference (means taken only if interference was detected) or in general (means are always taken, even if no interference was detected), one or more of the following measures may be applied:
1) carrier frequency hopping in case of a detected interference
2) subcarrier frequency hopping in case of a detected interference
3) variation of bit values in binary protocol in case of a detected interference
4) combinations of 1) . . . 3)

The invention claimed is:

1. A method for capacitive sensing, said method comprising the steps of
generating a control signal and supplying said control signal to a transmitter, said control signal causing said transmitter to generate a transmitting signal;
detecting a response signal, said response signal being responsive to a transfer behaviour of a transfer channel for said transmitting signal;
determining at least one characteristic of said transfer behaviour from said response signal;
said method further comprising the further steps of:
tagging said transmitting signal by modulating a sub-carrier signal on said transmitting signal;
validating the result of said determining step by demodulating said sub-carrier signal out of said response signal.

2. The method according to claim 1, wherein said validating step further comprises the step of determining at least one characteristic of said transfer behaviour from said demodulated response signal.

3. The method according to claim 1, wherein said step of tagging said transmitting signal comprises the steps of
generating a carrier signal and a subcarrier signal,
supplying said carrier signal and said sub-carrier signal to a first modulator, and
supplying the output signal of said first modulator as control signal to said transmitter.

4. The method according to claim 1, further comprising the steps of
modulating known information on said sub-carrier signal, and
demodulating of said known information out of said sub-carrier to further confirm origin of said response signal.

5. The method according to claim 4, wherein said known information comprises a binary protocol.

6. The method according to claim 5, further comprising the step of varying bit values in said binary protocol in case of a detected interference.

7. The method according to claim 1, further comprising frequency hopping of said carrier signal and/or said sub-carrier signal.

8. The method according to claim 1, wherein said transfer channel is established between said transmitter and a receiver and wherein said response signal is a received signal at said receiver.

9. The method according to claim 1, wherein said transfer channel is established between said transmitter and ground potential and wherein said response signal is an internal signal generated inside said transmitter in response to generation of said transmitting signal.

10. A method for capacitive sensing, said method comprising the steps of
generating a carrier signal
generating a first sub-carrier signal,
supplying said carrier signal and said first sub-carrier signal to a first modulator, and
supplying the output signal of said first modulator as a first control signal to a transmitter, said first control signal causing said transmitter to generate a first transmitting signal;
detecting a first response signal, said first response signal being responsive to a transfer behaviour of a transfer channel for said first transmitting signal;
determining at least one characteristic of said transfer behaviour from said first response signal;
said method further comprising the further steps of validating the result of said determining step by
generating a second sub-carrier signal,
supplying said carrier signal and said second sub-carrier signal to said first modulator, and
supplying the output signal of said first modulator as a second control signal to said transmitter, said second control signal causing said transmitter to generate a second transmitting signal;
detecting a second response signal, said second response signal being responsive to a transfer behaviour of said transfer channel for said second transmitting signal;
determining at least one characteristic of said transfer behaviour from said first response signal;
demodulating said sub-carrier out of said second response signal; and
determining at least one characteristic of said transfer behaviour from said demodulated second response signal.

11. The method according to claim 10, wherein said first sub-carrier signal is a DC signal and wherein said second sub-carrier signal is a time variant signal.

12. The method according to claim 10, further comprising the steps of
modulating known information on said sub-carrier signal, and
demodulating of said known information out of said sub-carrier to further confirm origin of said response signal.

13. The method according to claim 12, wherein said known information comprises a binary protocol.

14. The method according to claim 13, further comprising the step of varying bit values in said binary protocol in case of a detected interference.

15. The method according to claim 10, further comprising frequency hopping of said carrier signal and/or said sub-carrier signal.

16. The method according to claim 10, wherein said transfer channel is established between said transmitter and a receiver and wherein said response signal is a received signal at said receiver.

17. The method according to claim 10, wherein said transfer channel is established between said transmitter and ground potential and wherein said response signal is an internal signal generated inside said transmitter in response to generation of said transmitting signal.

* * * * *